(12) United States Patent
Breitwisch

(10) Patent No.: US 8,129,268 B2
(45) Date of Patent: Mar. 6, 2012

(54) SELF-ALIGNED LOWER BOTTOM ELECTRODE

(75) Inventor: Matthew J. Breitwisch, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/619,375

(22) Filed: Nov. 16, 2009

(65) Prior Publication Data

US 2011/0115087 A1 May 19, 2011

(51) Int. Cl.
*H01L 21/4763* (2006.01)

(52) U.S. Cl. ........ 438/626; 438/618; 438/622; 438/675; 257/E21.575; 257/E21.576; 257/E21.577; 257/E21.58; 257/E21.583; 257/E21.585

(58) Field of Classification Search ........... 257/E21.575, 257/E21.576, E21.577, E21.58, E21.583, 257/E21.585; 438/618, 622, 626, 675
See application file for complete search history.

(56) References Cited

U.S. PATENT DOCUMENTS

| | | | |
|---|---|---|---|
| 6,177,329 B1 * | 1/2001 | Pang | 438/400 |
| 6,797,612 B2 | 9/2004 | Zahorik | |
| 7,224,068 B2 * | 5/2007 | Tseng et al. | 257/774 |
| 7,324,365 B2 | 1/2008 | Gruening-von Schwerin et al. | |
| 7,545,668 B2 | 6/2009 | Philipp et al. | |
| 2007/0029606 A1 | 2/2007 | Noh et al. | |
| 2007/0108488 A1 | 5/2007 | Suh et al. | |
| 2007/0197012 A1 * | 8/2007 | Yang et al. | 438/597 |
| 2007/0246440 A1 | 10/2007 | Sato | |
| 2007/0246782 A1 | 10/2007 | Philipp et al. | |
| 2007/0252127 A1 | 11/2007 | Arnold et al. | |
| 2008/0023685 A1 | 1/2008 | Czubatyj et al. | |
| 2008/0137400 A1 | 6/2008 | Chen et al. | |
| 2008/0138931 A1 | 6/2008 | Lung | |
| 2008/0197333 A1 | 8/2008 | Lung | |
| 2009/0072216 A1 | 3/2009 | Lung et al. | |

OTHER PUBLICATIONS

Song, Y.J. et al., "Highly Reliable 256Mb PRAM with Advanced Ring Contact Technology and Novel Encapsulating Technology", VLSI Technology, 2006, Digest of Technical Papers, 2006 Symposium on; pp. 118-119.

S. Raoux et al., "Phase-change random access memory: A scalable technology", IBM J Res. & Dev. vol. 52. 4/5 Jul./Sep. 2008 pp. 465-479.

Song, Y.J. et al, "Advanced ring type contact technology for high density phase change memory", Solid-State Device Research Conference, 2005, ESSDERC 2005, Proceedings of 35th European; Sep. 12-16, 2005 pp. 513-516.

(Continued)

*Primary Examiner* — N Drew Richards
*Assistant Examiner* — Yu-Hsi D Sun
(74) *Attorney, Agent, or Firm* — Cantor Colburn LLP; Vazken Alexanian

(57) ABSTRACT

A method of fabricating a lower bottom electrode for a memory element and a semiconductor structure having the same includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via to an upper surface of each conductive contact, removing the planarizing material, depositing electrode material over the dielectric cap layer and within the vias, the electrode material contacting an upper surface of each conductive contact, and planarizing the electrode material to form a lower bottom electrode over each conductive contact.

17 Claims, 8 Drawing Sheets

OTHER PUBLICATIONS

Der-Sheng Chao et al., "Low Programming Current Phase Change Memory Cell with Double GST Thermally Confined Structure", VLSI Technology, 2006, Systems and Applications, 2007, VLSI-TSA 2007, International Symposium on; Apr. 23-25, 2007 pp. 1-2.

Phase-change chalcogenide nonvolatile RAM completely based on CMOS technology, Y. N. Hwang et al., 2003 International Symposium on VLSI Technology, Systems, and Applications (IEEE), Oct. 6-8, 2003, pp. 29-31.

* cited by examiner

SELF-ALIGNED LOWER BOTTOM ELECTRODE

BACKGROUND

The present invention relates generally to semiconductor structures, and more specifically, to a method for fabricating a self-aligned lower bottom electrode for a semiconductor structure which does not require a lithographic masking process, is substantially seam free, and which has minimal topography (i.e., is flat).

A memory cell requires a highly scaled portion of the memory cell to be defined. In one conventional method, a mushroom-type phase change memory cell is formed by first forming a flat lower bottom electrode on which a scaled bottom electrode is formed. The lower bottom electrode may be made by forming a lithography-defined hole, filling the hole with a conductive material and then performing a polishing process to polish the conductive material.

There are several problems associated with the conventional method. These problems include the need for an additional lithography process. The lithography process requires additional costs and may result in an undesirable alignment of the of the lower bottom electrode.

SUMMARY

The present invention provides a manner in which to minimize the processing costs by minimizing the number of lithographic masking levels used within a memory cell. Therefore, the present invention provides a method for fabricating a mask-less, self-aligned lower bottom electrode for a memory cell.

According to one embodiment a method of fabricating a lower bottom electrode for a memory element is provided. The method includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via to an upper surface of each conductive contact, removing the planarizing material, depositing electrode material over the dielectric cap layer and within the vias, the electrode material contacting an upper surface of each conductive contact, and planarizing the electrode material to form a lower bottom electrode over each conductive contact.

According to another embodiment of the present invention, a method of fabricating a lower bottom electrode for a memory element is provided. The method includes forming a dielectric layer over a semiconductor substrate having a plurality of conductive contacts formed therein to be connected to access circuitry, forming a dielectric cap layer over exposed portions of the dielectric layer and the conductive contacts, depositing a planarizing material over the dielectric cap layer, etching a via exposing an upper surface and respective side surfaces of each conductive contact along with a portion of an upper surface of the dielectric layer adjacent to the conductive contact, removing the planarizing material, depositing electrode material over the dielectric cap layer and within the vias. The electrode material contacts the upper surface and the respective side surfaces of each conductive contact along with the portion of the upper surface of dielectric layer. The method further includes planarizing the electrode material to form a lower bottom electrode over each conductive contact.

According to another embodiment of the present invention, a semiconductor structure is provided. The semiconductor structure includes a semiconductor substrate having a dielectric layer formed thereon and conductive contacts formed therein to be connected with access circuitry, a dielectric cap layer formed over exposed portions of the dielectric layer, and a lower bottom electrode formed over each conductive contact. The lower bottom electrode is self-aligned to an upper surface of the conductive contact.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

The present invention provides a flat lower bottom electrode for a memory element to be included in advanced CMOS technologies, bi-CMOS technologies and SiGe-based technologies. The fabrication of the flat lower bottom electrode 112 (depicted in FIG. 7) will now be described below with reference to FIGS. 1 through 7.

Figure 1:
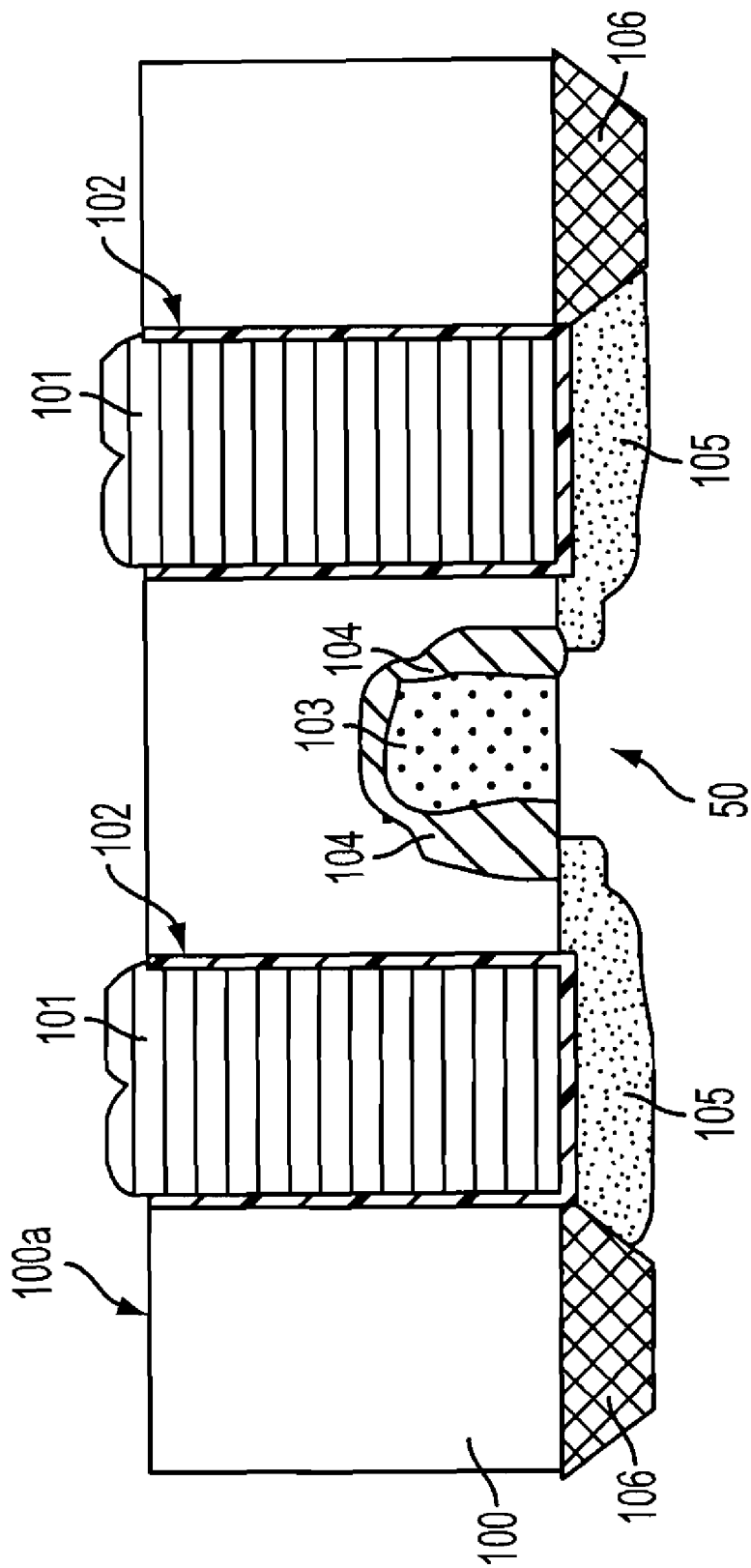
FIG. 1 is a diagram illustrating a semiconductor substrate of a semiconductor structure that can be implemented within embodiments of the present invention.

With reference now to FIG. 1, a diagram illustrating a semiconductor substrate of a semiconductor structure that can be implemented within embodiments of the present invention is provided. As shown in FIG. 1, a substrate 50 having a dielectric layer 100 (e.g., a borophosphosilicate glass (BPSG) dielectric layer) formed thereon is provided.

The present invention is not limited to a BPSG type wafer and any suitable type of wafer may be utilized for the purpose set forth herein. A plurality of conductive contacts 101 are formed in the BPSG dielectric layer 100 and surrounded by a liner 102 of titanium nitride, for example, used prior to the deposition of the contact fill, to form the conductive contacts 101. According to an embodiment of the present invention, the conductive contacts 101 may include tungsten (W), or titanium nitride (TiN), or copper (Cu), for example. The conductive contacts 101 are connected to access circuitry (e.g., an access transistor) within the substrate 50. The access transistor includes a gate 103 and spacers 104 adjacent to the sidewalls of the gate 103, and source/drain regions 105. Shallow trench isolation (STI) regions 106 are formed within the substrate 50 to provide electrical isolation between the access transistor and other devices. The conductive contacts 101 connect to the source/drain regions 105. Typically at the top surface 100a of the BPSG dielectric layer 100, the conductive contacts 101 protrude from the surface 100a by about 40 nanometers (nm). However, if the conductive contacts are flushed with the surface 100a, a recessing operation of the BPSG dielectric layer 100 is performed as discussed below with reference to FIG. 2.

Figure 2:
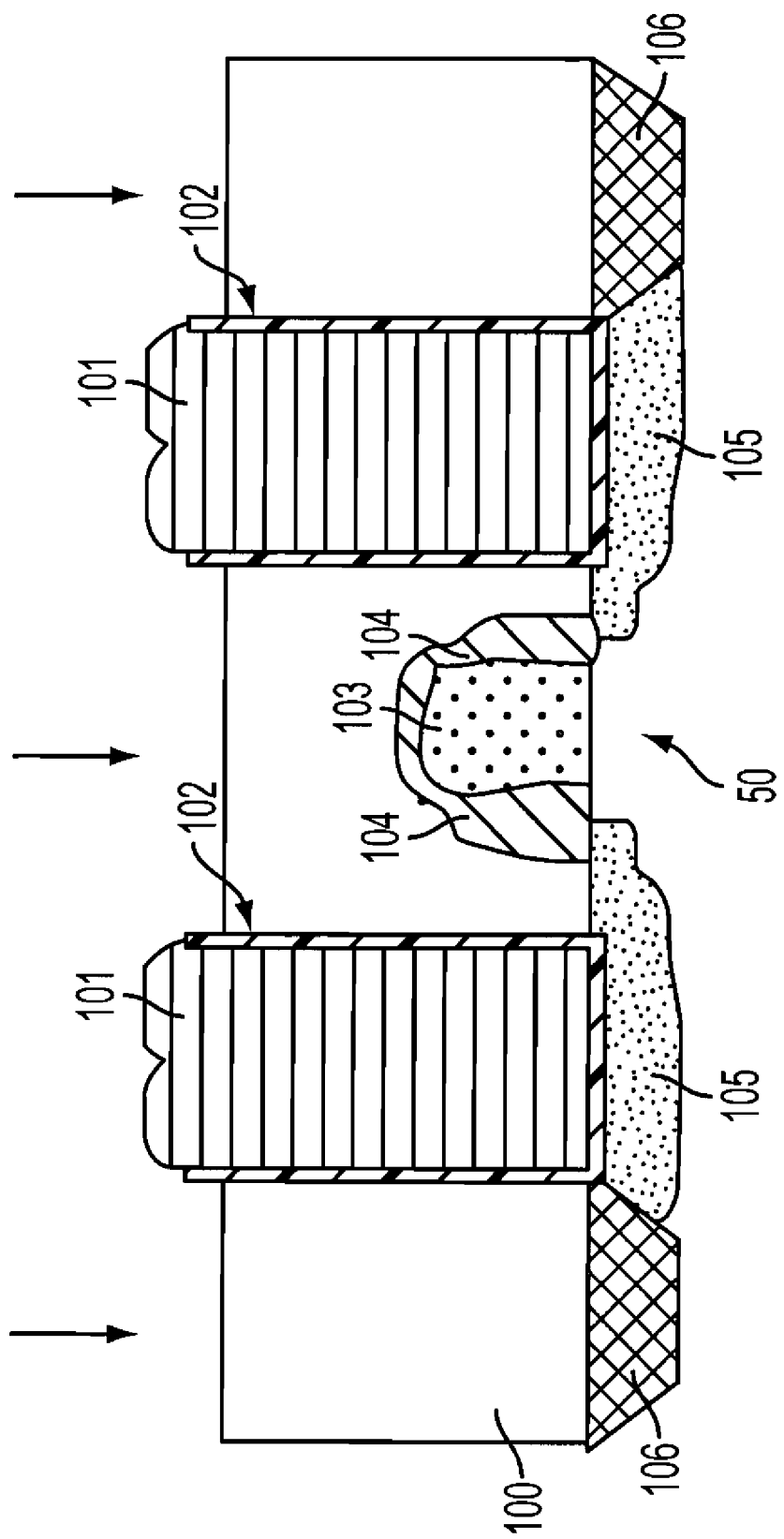
FIG. 2 is a diagram illustrating a recess operation of a dielectric layer formed on the semiconductor substrate that can be implemented within embodiments of the present invention.

FIG. 2 is a diagram illustrating a recessing operation of the BPSG dielectric layer 100 that can be implemented within embodiments of the present invention. When the conductive contact 101 is flush with the surface 100a of the BPSG dielectric layer 100, the BPSG dielectric layer 100 is recessed (as indicated by the arrows shown) using a wet etch operation such as a buffered oxide etch (BOE) or diluted hydrofluoric acid (DHF) so that the conductive contacts 101 protrude over the dielectric layer 100 by about 40 nanometers (nm) to about 60 nanometers (nm).

Figure 3:
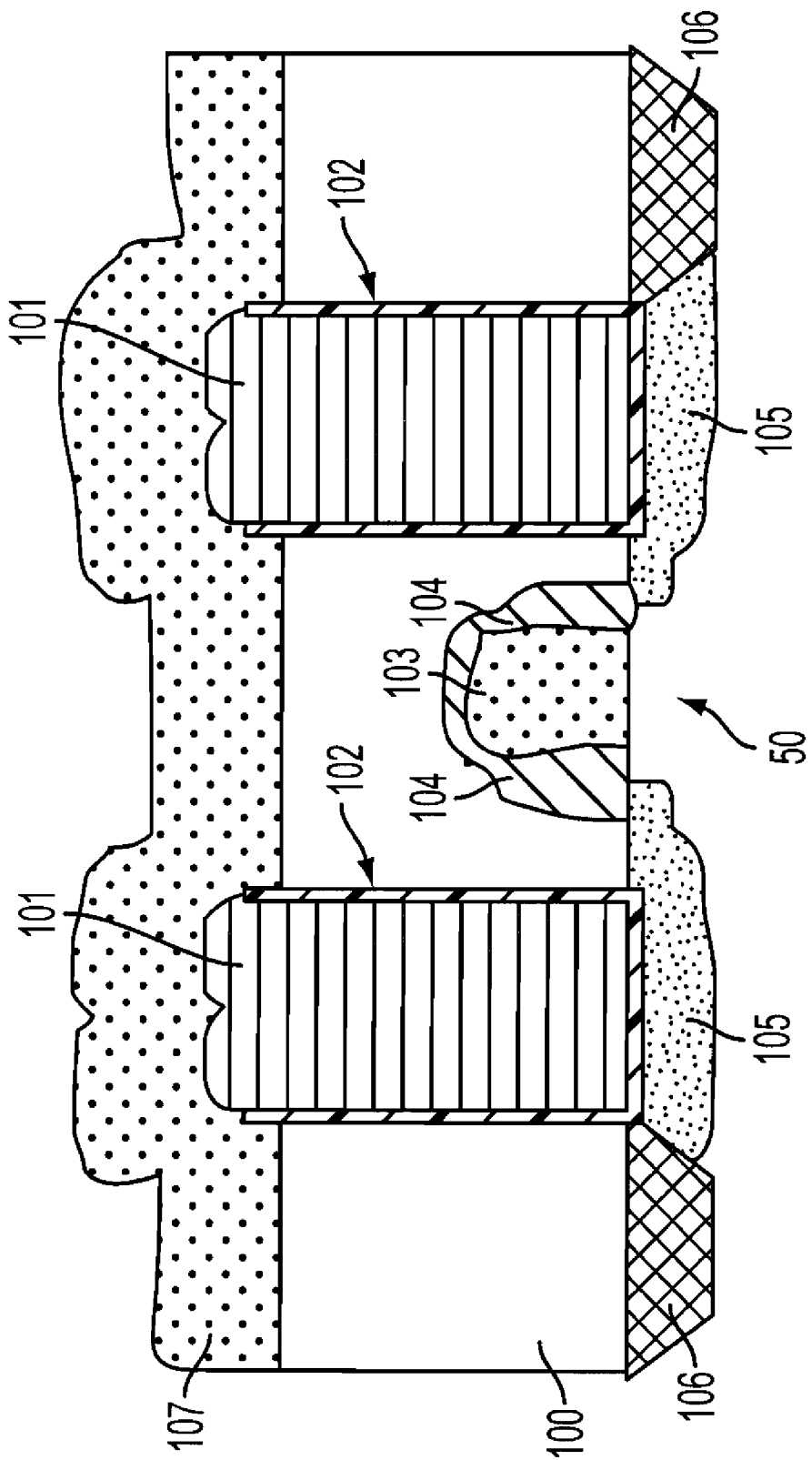
FIG. 3 is a diagram illustrating a deposition operation of a dielectric cap layer that can be implemented within embodiments of the present invention.

FIG. 3 is a diagram illustrating a deposition operation of a dielectric cap layer that can be implemented within embodiments of the present invention. As shown in FIG. 3, a dielectric cap layer 107 is formed over the exposed BPSG dielectric layer 100, the conductive contacts 101 and the exposed liner 102. The dielectric cap layer 107 copies the topology of the underlying layers. The dielectric cap layer 107 is formed of a predetermined thickness ranging from approximately 80 nanometers (nm) to approximately 130 nanometers (nm). The dielectric cap layer 107 may include silicon nitride (SiN) or silicon dioxide ($SiO_2$), for example, however the present invention is not limited hereto. According to one embodiment of the present invention, the dielectric cap layer 107 is formed of silicon nitride processed at a temperature of 400 degrees C. Fabrication processes of a lower bottom electrode will now be described below with reference to FIGS. 4 through 7 below.

Figure 4:
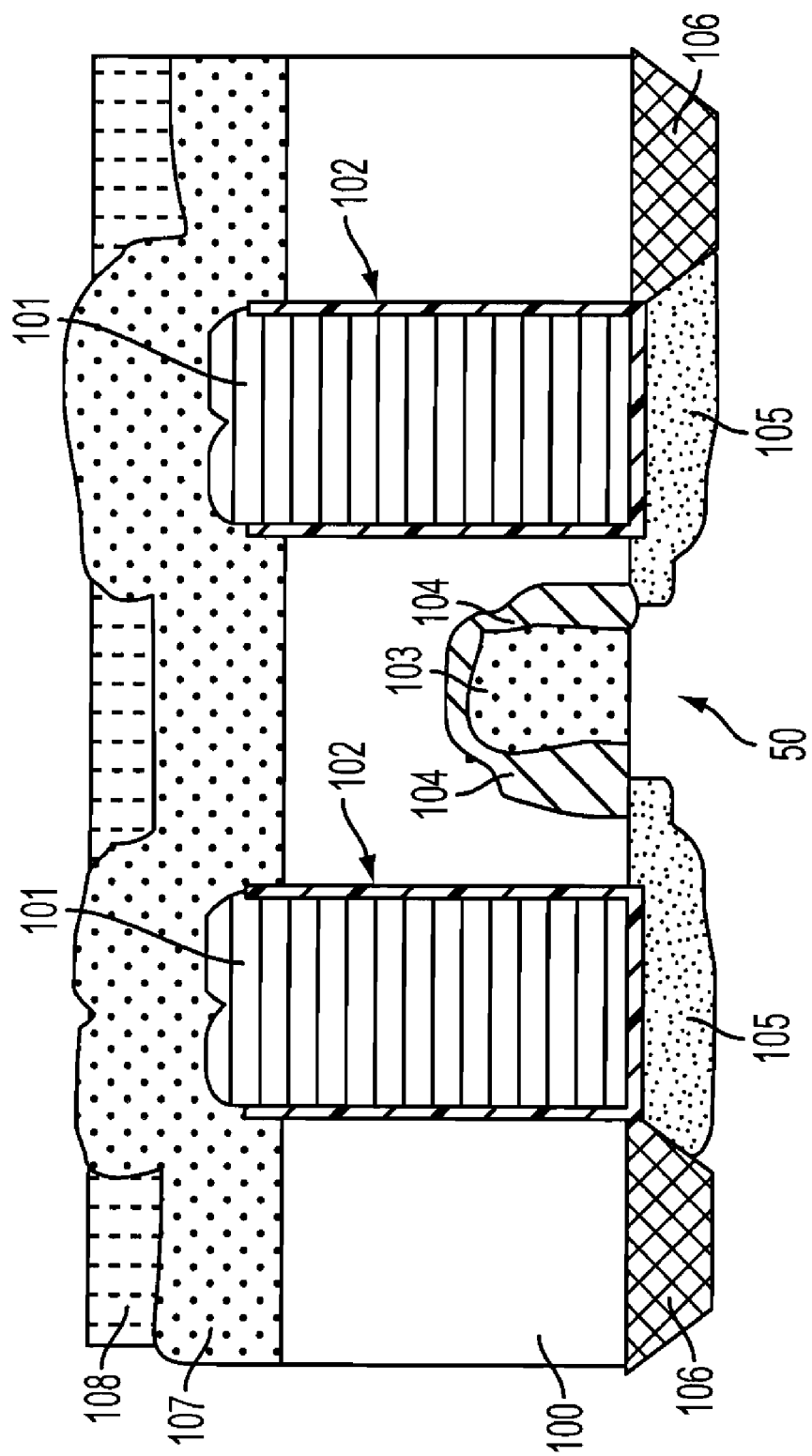
FIG. 4 is a diagram illustrating a deposition of a planarizing material that can be implemented within embodiments of the present invention.

FIG. 4 is a diagram illustrating a deposition of a planarizing material that can be implemented within embodiments of the present invention. In FIG. 4, a planarizing material 108 may be spin on an upper surface of the dielectric cap layer 107. According to an embodiment of the present invention, the planarizing material 108 may be a photo resist layer, an anti-reflective coating (ARC) or a near frictionless carbon (NFC), for example.

Figure 5:
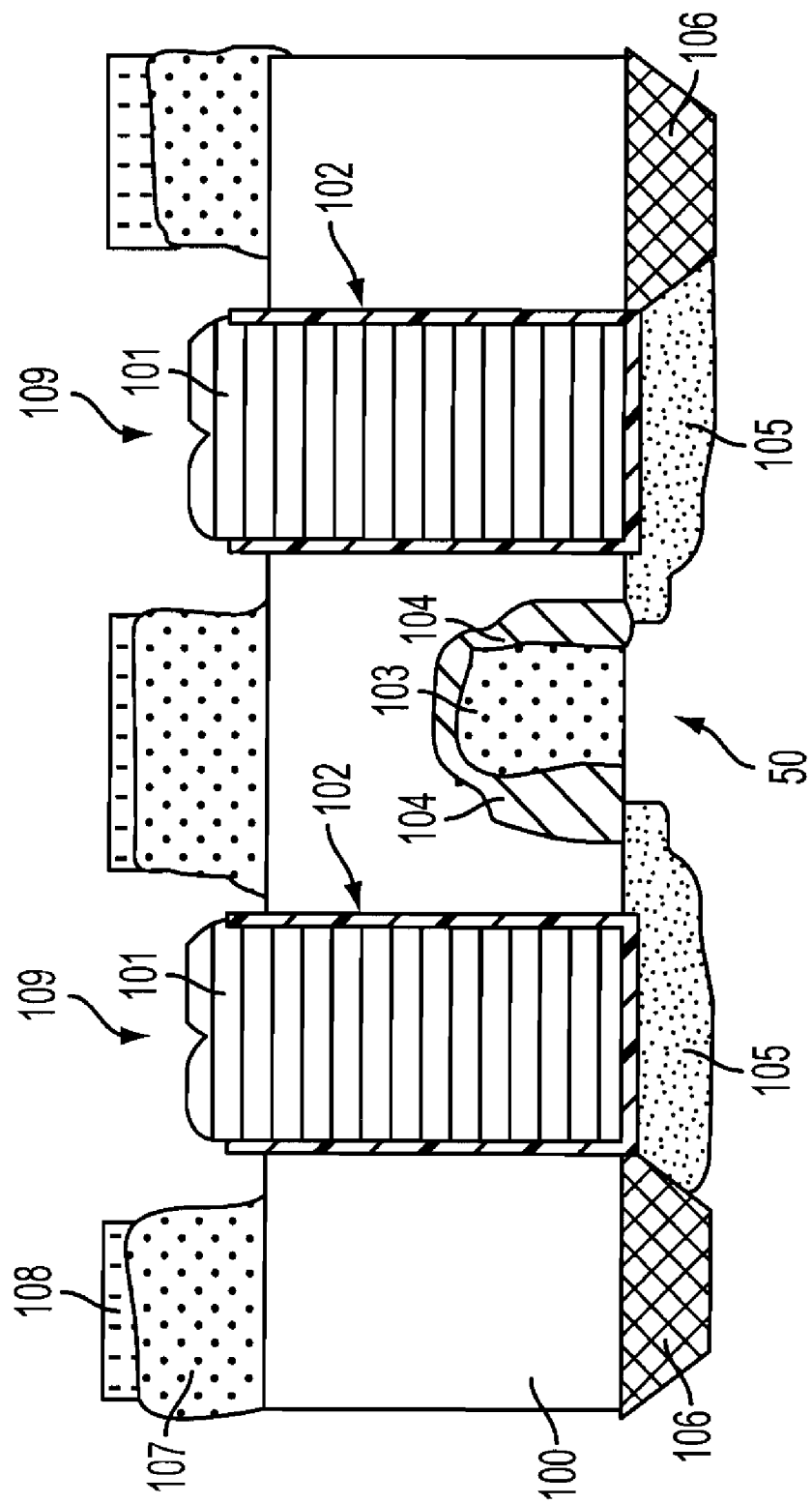
FIG. 5 is a diagram illustrating an etching operation for forming a lower bottom electrode for a memory element that can be implemented within embodiments of the present invention.

FIG. 5 is a diagram illustrating an etching operation for forming a bottom electrode for a memory element that can be implemented within embodiments of the present invention. In FIG. 5, the dielectric cap layer 107 and the planarizing material 108 are etched back by a reactive ion etching (RIE) operation, for example, to remove the layers 107 and 108 from an upper surface of the conductive contacts 101. The etching process forms vias 109 to the upper surface of the conductive contacts 101. According to one embodiment of the present invention, the forming of the via 109 includes etching to expose an upper surface and respective side surfaces of each conductive contact along with a portion of an upper surface of the dielectric layer adjacent to the conductive contact as shown.

Further, a chemical mechanical polishing (CMP) process may be performed to remove any remaining dielectric cap layer 107 from the upper surface of the conductive contacts 101.

Figure 6:
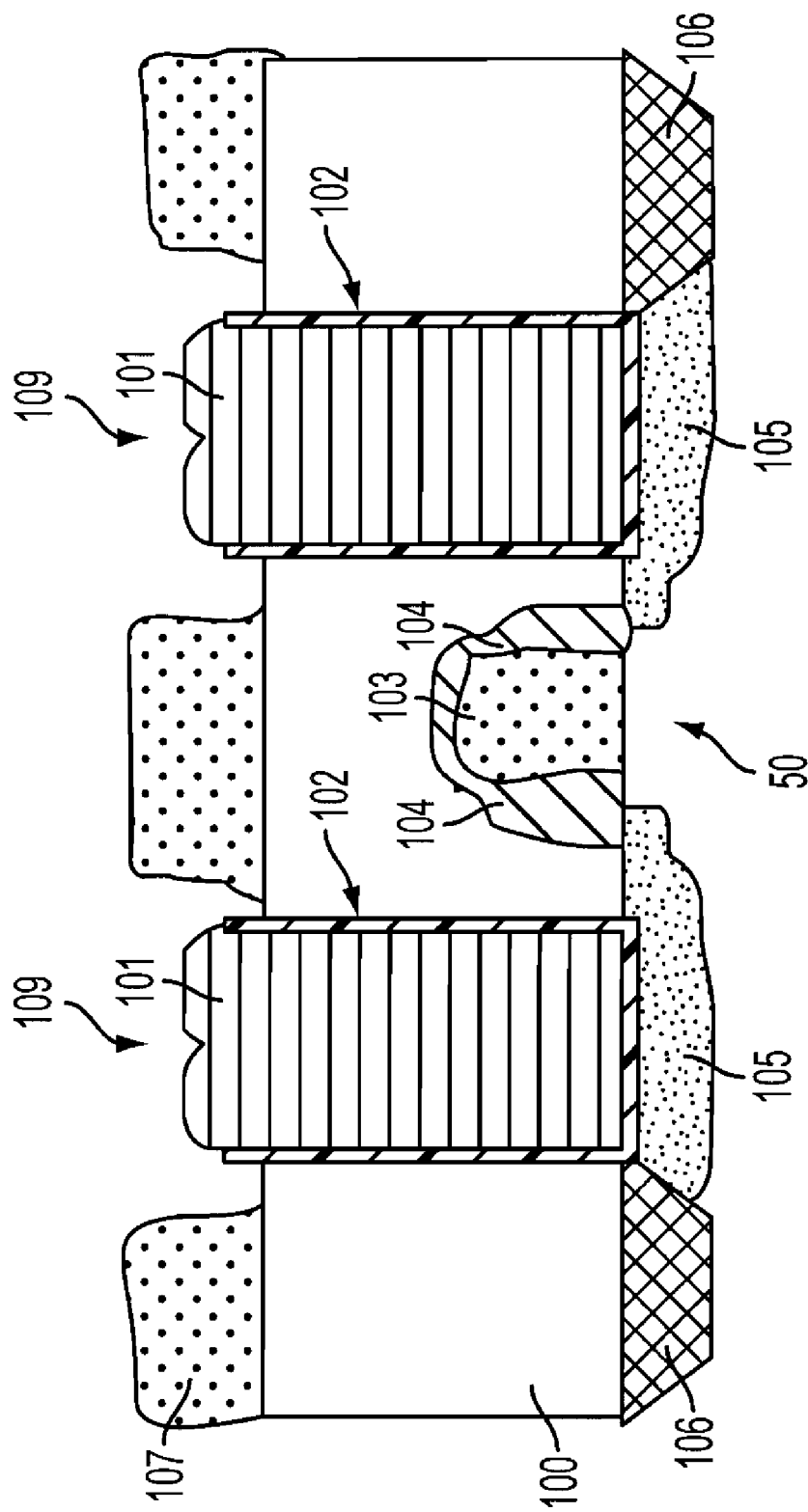
FIG. 6 is a diagram illustrating a removal operation of the planarizing material that can be implemented within embodiments of the present invention.

FIG. 6 is a diagram illustrating is a diagram illustrating a removal operation of the planarizing material that can be implemented within embodiments of the present invention. As shown in FIG. 6, the planarizing material 108 is removed by conventional etching processes. Now, the formation of the bottom electrode will now be described below with reference to FIGS. 7 and 8.

Figure 7:
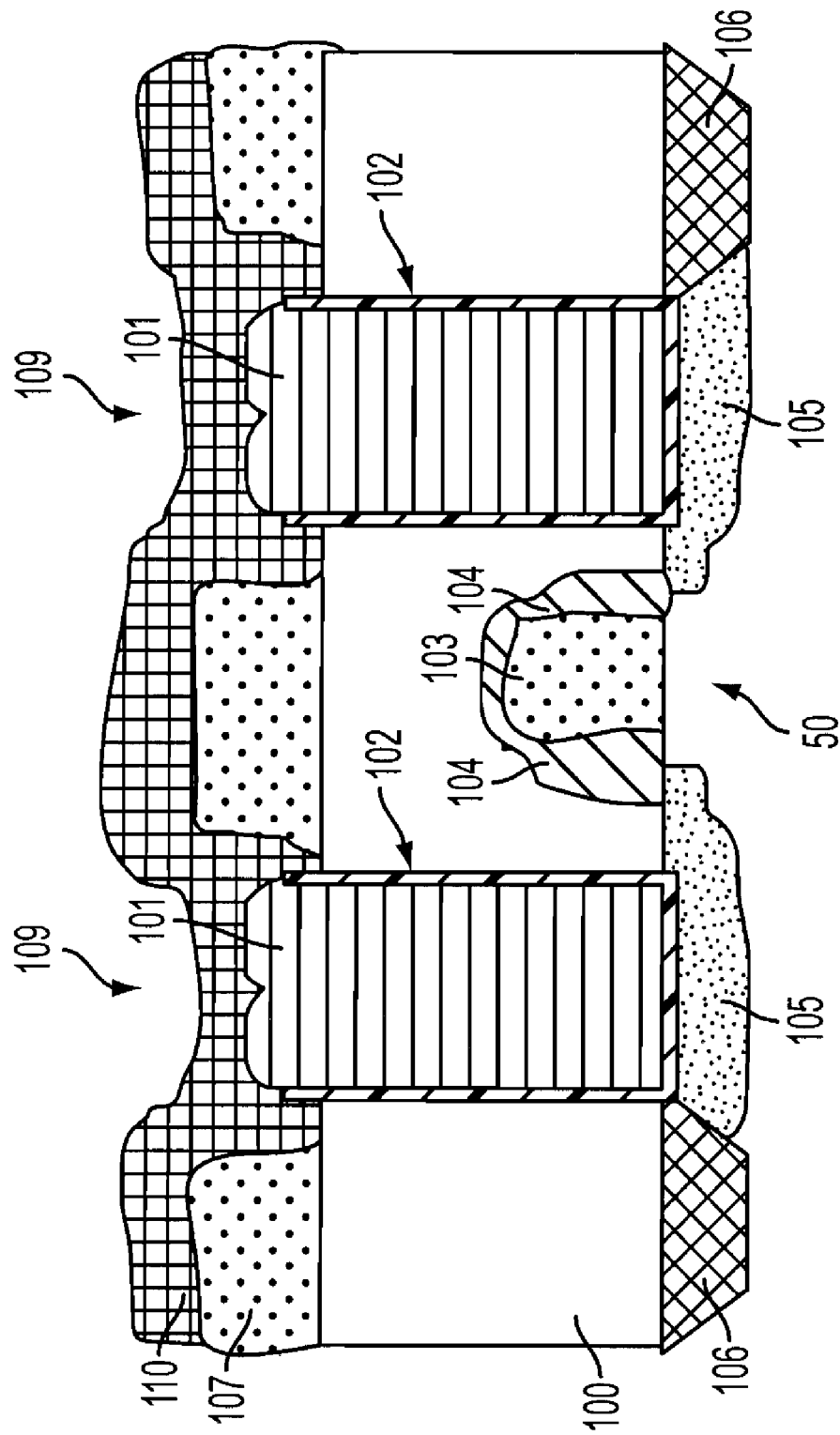
FIG. 7 is a diagram illustrating a deposition operation of electrode material for forming the lower bottom electrode for a memory element that can be implemented within embodiments of the present invention.

FIG. 7 is a diagram illustrating a deposition operation of electrode material for forming a bottom electrode that can be implemented within embodiments of the present invention. As shown in FIG. 7, electrode material 110 is deposited on the dielectric cap layer 107 and within the vias 109. According to an embodiment of the present invention, the electrode material 110 may include chemical vapor deposition (CVD) titanium nitride (TiN), tungsten (W), silicon (Si), tantalum nitride (TaN), ruthenium (Ru) or any suitable conductive material.

Figure 8:
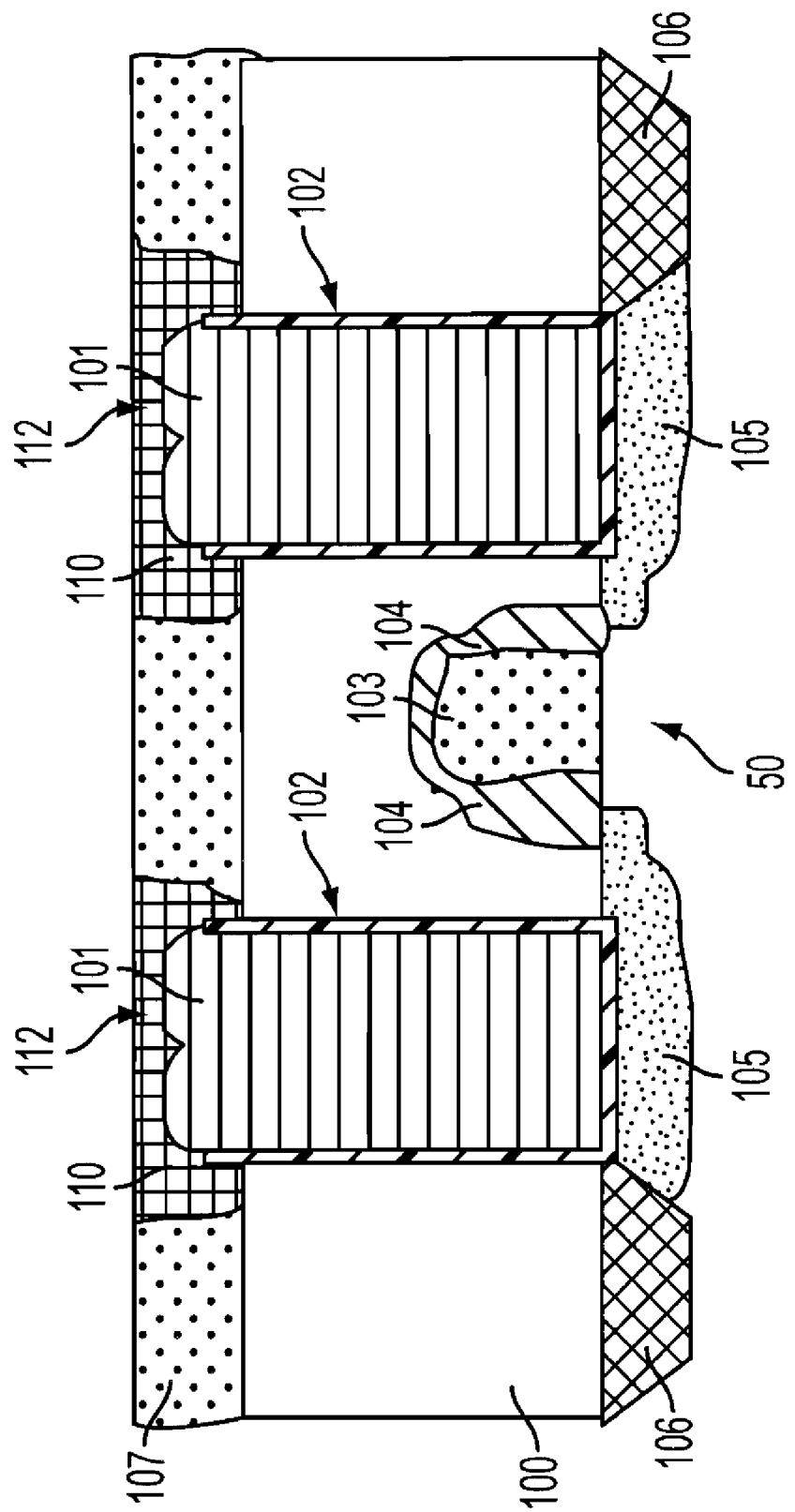
FIG. 8 is a diagram illustrating a lower bottom electrode that can be implemented within embodiments of the present invention.

FIG. 8 is a diagram illustrating a planarization operation of the electrode material forming a lower bottom electrode that can be implemented within embodiments of the present invention. As shown in FIG. 8, the electrode material 110 is planarized using a chemical mechanical polishing (CMP) process, to form a lower bottom electrode 112 over each conductive contact 101. According to an embodiment of the present invention, the lower bottom electrode 112 is self-aligned with the upper surface of the conductive contact 101. In one embodiment of the present invention, the dielectric cap layer 107 acts as a CMP stop layer. The electrode material 110 is of a predetermined thickness over the conductive contact 101. According to one embodiment of the present invention, the predetermined thickness ranges from about 10 nanometers (nm) to approximately 50 nanometers (nm). According to one embodiment of the present invention, the electrode material 110 contacts the upper surface and the respective side surfaces of each conductive contact 101. The electrode material 110 which is formed along the respective side surfaces of the conductive contacts 101 is a predetermined width ranging from approximately 5 nanometers (nm) to approximately 50 nanometers (nm).

Embodiments of the present invention provide a method of fabricating a maskless, flat lower bottom electrode in a semiconductor structure. Therefore, the present invention provides the advantages of minimizing the number of masking levels and in turn minimizing associated processing costs.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method of fabricating a lower bottom electrode for a memory element, the method comprising:
    forming a dielectric layer over a semiconductor substrate having a plurality of conductive contacts formed therein to be connected to access circuitry;
    forming a dielectric cap layer over exposed portions of the dielectric layer and the conductive contacts;
    depositing a planarizing material over the dielectric cap layer;
    etching a via to an upper surface of each conductive contact;
    removing the planarizing material;
    performing a planarizing operation to remove any remaining dielectric cap layer from the upper surface of the conductive contacts;
    following the planarizing operation, depositing electrode material over the dielectric cap layer and within the vias, the electrode material contacting an upper surface of each conductive contact; and
    planarizing the electrode material to form a lower bottom electrode over each conductive contact.

2. The method of claim 1, further comprising:
    recessing the dielectric layer a predetermined distance such that the conductive contacts protrude over the dielectric layer approximately 40 nanometers (nm) to approximately 60 nanometers (nm) prior to forming the dielectric cap layer.

3. The method of claim 1, wherein the dielectric cap layer is formed of a predetermined thickness ranging from approximately 80 nanometers (nm) to approximately 130 nanometers (nm).

4. The method of claim 1, wherein the planarizing material is deposited via a spin-on operation.

5. The method of claim 4, wherein the planarizing material is one of a photo resist layer, an antireflective coating (ARC) or a near frictionless carbon (NFC).

6. The method of claim 1, wherein etching a via to an upper surface of each conductive contact includes etching of the dielectric cap layer and the planarizing material via a reactive ion etching (RIE) operation.

7. The method of claim 1, wherein the electrode material comprises at least one of chemical vapor deposition (CVD) titanium nitride (TiN), tungsten (W), silicon (Si), -tantalum nitride (TaN), or ruthenium (Ru).

8. The method of claim 1, wherein the lower bottom electrode is of a predetermined thickness above each conductive contact, wherein the predetermined thickness ranges from approximately 10 nanometers (nm) to approximately 50 nanometers (nm).

9. A method of fabricating a lower bottom electrode for a memory element, the method comprising:
    forming a dielectric layer over a semiconductor substrate having a plurality of conductive contacts formed therein to be connected to access circuitry;
    forming a dielectric cap layer over exposed portions of the dielectric layer and the conductive contacts;
    depositing a planarizing material over the dielectric cap layer;
    etching a via exposing an upper surface and respective side surfaces of each conductive contact along with a portion of an upper surface of the dielectric layer adjacent to the conductive contact;
    removing the planarizing material;
    performing a planarizing operation to remove any remaining dielectric cap layer from the upper surface of the conductive contacts;
    following the planarizing operation, depositing electrode material over the dielectric cap layer and within the vias, the electrode material contacting the upper surface and the respective side surfaces of each conductive contact along with the portion of the upper surface of dielectric layer; and
    planarizing the electrode material to form a lower bottom electrode over each conductive contact.

10. The method of claim 9, wherein the electrode material formed along the respective side surfaces of the conductive contacts is a predetermined width ranging from approximately 5 nanometers (nm) to approximately 50 nanometers (nm).

11. The method of claim 9, further comprising:
    recessing the dielectric layer a predetermined distance such that the conductive contacts protrude over the dielectric layer approximately 40 nanometers (nm) to approximately 60 nanometers (nm) prior to forming the dielectric cap layer.

12. The method of claim 9, wherein the dielectric cap layer is formed of a predetermined thickness ranging from approximately 80 nanometers (nm) to approximately 130 nanometers (nm).

13. The method of claim 9, wherein the planarizing material is deposited via a spin-on operation.

14. The method of claim 13, wherein the planarizing material is one of a photo resist layer, an antireflective coating (ARC) or a near frictionless carbon (NFC).

15. The method of claim 9, wherein etching a via to an upper surface of each conductive contact includes etching of the dielectric cap layer and the planarizing material via a reactive ion etching (RIE) operation.

16. The method of claim 9, wherein the electrode material comprises at least one of chemical vapor deposition (CVD) titanium nitride (TiN), tungsten (W), silicon (Si), tantalum nitride (TaN), or ruthenium (Ru).

17. The method of claim 9, wherein the electrode material comprises at least one of chemical vapor deposition (CVD) titanium nitride (TiN), tungsten (W), silicon (Si), tantalum nitride (TaN), or ruthenium (Ru).

* * * * *